(12) United States Patent
Ohkubo

(10) Patent No.: US 6,285,208 B1
(45) Date of Patent: Sep. 4, 2001

(54) ACTIVATION SPEED OF SIGNAL WIRING LINE IN SEMICONDUCTOR INTEGRATED CIRCUIT

(75) Inventor: Miyoshi Ohkubo, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/229,018

(22) Filed: Jan. 12, 1999

(30) Foreign Application Priority Data

Jan. 26, 1998 (JP) .................................................. 10-012331

(51) Int. Cl.$^7$ .......................... H03K 19/003; H03K 17/16
(52) U.S. Cl. ................................ 326/15; 326/30; 326/82; 326/101
(58) Field of Search .................................. 326/15, 30, 26, 326/82, 101

(56) References Cited

U.S. PATENT DOCUMENTS

| | | | |
|---|---|---|---|
| 4,587,445 | * | 5/1986 | Kanuma .................................. 326/28 |
| 4,761,572 | * | 8/1988 | Tanizawa .............................. 327/310 |
| 5,306,967 | * | 4/1994 | Dow ...................................... 326/101 |
| 5,436,573 | * | 7/1995 | Ogawa et al. .......................... 326/17 |
| 5,712,585 | * | 1/1998 | Jeong ................................... 327/293 |

FOREIGN PATENT DOCUMENTS

| | | |
|---|---|---|
| 63-78394 | 4/1988 | (JP) . |
| 4-196226 | 7/1992 | (JP) . |
| 5-82646 | 4/1993 | (JP) . |
| 5-90939 | 4/1993 | (JP) . |
| 8-306867 | 11/1996 | (JP) . |
| 9-237870 | 9/1997 | (JP) . |
| 9-307061 | 11/1997 | (JP) . |

* cited by examiner

*Primary Examiner*—Michael Tokar
*Assistant Examiner*—Daniel D. Chang
(74) *Attorney, Agent, or Firm*—Hutchins, Wheeler & Dittmar

(57) ABSTRACT

A semiconductor integrated circuit includes a plurality of signal wiring lines, and a plurality of shield wiring lines, each of which is arranged between adjacent two of the plurality of signal wiring lines. An interference preventing section is connected to the plurality of shield wiring lines, and supplies an inference preventing signal to two of the plurality of shield wiring lines adjacent to a specific one of the plurality of signal wiring lines. The inference preventing signal is switched to have a same phase as an input signal which is supplied to the specific signal wiring line.

19 Claims, 13 Drawing Sheets

ACTIVATION SPEED OF SIGNAL WIRING LINE IN SEMICONDUCTOR INTEGRATED CIRCUIT

BACKGROUND OF THE INVENTION

1. Field of the Invention

The present invention relates to a semiconductor integrated circuit, and more particularly to a semiconductor integrated circuit in which delay due to a parasitic capacitance between wiring lines can be reduced.

2. Description of the Related Art

In a conventional semiconductor integrated circuit, various signal wiring lines such as aluminum wiring lines are used to connect between circuit blocks of the semiconductor integrated circuit. The signal wiring lines are always accompanied by parasitic capacities. If the parasitic capacitance is large, the activation speed of the signal wiring line is delayed so that the circuit operation speed becomes slow, or late. As a result, the circuit characteristic of the semiconductor integrated circuit is degraded.

Also, in order to prevent the delay of the circuit operation speed, it is necessary to make an output transistor of a drive circuit sufficiently large such that the parasitic capacitance can be driven sufficiently. As a result, this causes the increase of a chip size and the decrease of a production yield.

The delay due to a parasitic capacitance in the conventional semiconductor integrated circuit will be described with reference to FIG. 1. In FIG. 1, the semiconductor integrated circuit is composed of the buffer circuits B1 to B5 and signal wiring lines F1 to F5. The signal wiring lines F1 to F5 are arranged in parallel adjacently to each other. The signal wiring lines F1 to F5 have wiring line resistances R1 to R5, interline capacitances Cs12 to Cs45 between the signal wiring lines and interlayer capacitances Cdf1 to Cdf5 between the signal wiring lines and a semiconductor substrate or the ground, respectively. The buffer circuits B1 to B5 drive loads (not shown), the wiring line resistances R1 to R5, the interline capacitances Cs12 to Cs45 and the interlayer capacitances Cdf1 to Cdf5 in response to input signals IN1 to IN5, respectively.

Each interline capacitance Cs12 to Cs45 is a capacitance between adjacent wiring lines F1 to F5. Accordingly, the interline capacitance becomes larger as the space between adjacent wiring lines F1 to F5 becomes narrow.

Also, the interlayer capacitances Cdf1 to Cdf5 are capacitance between the respective signal wiring line F1 to F5 and lower wiring lines or a semiconductor substrate. The input signals IN1 to IN5 to the buffer circuit B1 to B5 are similar to decoded signals and only one of the input signals IN1 to IN5 is activated. For example, when the signal IN2 is a "H (high)" level, the signals IN1, IN3, IN4, IN5 are set to "L (low)" level. Therefore, when the signal IN2 of the signals IN1 to IN5 is set to the "H" level, only the signal wiring line F2 is set to the "H" level. All the remaining signal wiring lines F1, F3, F4 and F5 are set to "L" level.

That is, the semiconductor integrated circuit is in the output state ① in which only the signal wiring line F2 is selected. Next, when the signal IN4 is set to "H" level in the output state ①, only the signal wiring line F4 is set to the "H" level. All the remaining signal wiring lines F1, F2, F3 and F5 are set to "L" level. That is, the semiconductor integrated circuit is set to the output state ② in which only the signal wiring line F4 is selected.

The following table 1 shows a relation of the respective signals and the output states.

TABLE 1

| signal wiring line | output state ① | output state ② |
|---|---|---|
| F1 | L | L |
| F2 | H | L |
| F3 | L | L |
| F4 | L | H |
| F5 | L | L |

As seen from the table 1, when the state of the semiconductor integrated circuit is switched from the output state ① into the output state ②, the signal wiring line F4 is activated from the "L" level to the "H" level. At this time, the signal wiring line F2 is switched from the "H" level to the "L" level. However, the signal wiring lines F3 and F5 arranged adjacently are fixed to the "L" level. Therefore, the activation speed decreases due to the interline capacitances Cs34 and Cs45, when the signal wiring line F4 is switched from the inactive state into the active state.

The activation speed of the signal wiring line F4 is expressed by the following equation (1) using a time constant τ1.

$$\tau 1 = R4 \times (Cs34 + Cs45 + Cdf4) \quad (1)$$

As seen from the equation (1), as the interline capacitances Cs34 and Cs45 increase, the activation speed becomes slow.

Next, a second conventional example will be described with reference to FIG. 2. In FIG. 2, the second conventional example is different from the first conventional example in that each of shield wiring lines G1 to G4 is arranged between corresponding adjacent two of the signal wiring lines F1 to F5 shown in FIG. 1. These shield wiring lines G1 to G4 are all fixed to the ground potential GND.

Now, when the state is switched from the output state ① to the output state ② as show in the above table 1, the shield wiring lines G3 and G4 function to decrease the influence of coupling noise, which is generated when the signal wiring line F4 is switched from the "L" level to the "H" level, to the signal wiring lines F3 and F5.

However, the shield wiring lines G3 and G4 are fixed to the "L" level. When the signal wiring line F4 is switched from the "L" level to the "H" level, the activation speed decreases more than the influence of the interline capacitances CG34 and CG44. In this case, the activation speed of the signal wiring line F4 can be expressed by the following equation (2) using a time constant τ2.

$$\tau 2 = R4 \times (CG34 + CG44 + Cdf4) \quad (2)$$

As seen from the equation (2), it could be understood that the activation speed becomes slow as the interline capacitances CG34 and CG44 increase.

Next, a third conventional example will be described with reference to FIG. 3. In the above second conventional example, the shield wiring lines G1 to G4 are fixed to the GND potential. However, in the third embodiment, the shield wiring lines V1 to V4 are fixed to the power supply voltage Vcc. In this case, the shield wiring lines V3 and V4 also function to decrease the influence of coupling noise, which is generated when the signal wiring line F4 is switched in potential, to the signal wiring lines F3 and F5. However, the activation speed of the signal wiring line F4 decreases because of the influence of the interline capacitances CV34 and CV44, as in the second conventional example.

Next, the interline capacitance between wiring lines and the structure of the semiconductor integrated circuit will be described with reference to FIG. 4. FIG. 4 is a schematic cross sectional view of the semiconductor integrated circuit composed of an insulating film 2 which is formed on a semiconductor substrate 1 and the signal wiring lines F3 to F5 provided in the insulating film 2.

In FIG. 4, the signal wiring lines F3 to F5 are composed of metal wiring lines such as aluminum wiring lines. Each of the signal wiring lines F3 to F5 is electrically separated from the other wiring lines and the semiconductor substrate 1 by the insulating film 2 formed on the semiconductor substrate 1. Also, a wiring line interval S between every adjacent two of the signal wiring lines F3 to F5 is necessary to be made as narrow as possible for high chip integration levels. For this reason, the signal wiring lines F3 to F5 are generally arranged to have the wiring line interval S equal to or narrower than the wiring line layer interval d from the main surface of the semiconductor substrate 1 to the signal wiring line F3 to F5. Thus, the wiring line interval S is made narrower with the forming process of fine patterns. Therefore, the interline capacitances Cs34 and Cs45 between the wiring lines are made relatively large. There is a case that the interline capacitances Cs34 and Cs45 are approximately 3 times of the capacitance of interlayer capacitance Cdf4 between the signal wiring line F4 and the semiconductor substrate 1.

The typical values of the interline capacitances Cs34 and Cs45 and the interlayer capacitances Cdf3, Cdf4 and Cdf5 are as follows: Cs34 and Cs45=0.33 pF, Cdf3, Cdf4 and Cdf5=0.75 pF.

In the above-mentioned first conventional example, a plurality of signal wiring lines are arranged in parallel. In this case, the activation speed when one of the signal wiring lines is activated greatly depends on the interline capacitances between the other adjacent signal wiring lines. In the first conventional example, when a selected one of the signal wiring lines is activated, a potential difference is necessarily generated between the selected signal wiring line and another adjacent signal wiring line. Therefore, it is difficult to reduce the interline capacitance.

Also, the wiring line interval is made extremely narrow with the development of the forming process of fine patterns, so that the interline capacitance becomes large. Therefore, the influence of the delay due to the interline capacitance has become a serious problem.

Also, in the second and third conventional examples, the potentials of the shield wiring lines are fixed. Accordingly, the potential differences are generated between the signal wiring line and each of the shield wiring lines which are arranged on both sides of the signal wiring line. For this reason, it is difficult to reduce the interline capacitance. Therefore, there is a problem in that the activation speed of the signal wiring line decreases due to the interline capacitance between the signal wiring line and each of the shield wiring line.

A precharge clock signal generating circuit is described in Japanese laid Open Patent Application (JP-A-Showa 63-78394). In this reference, a precharge clock pulse for precharging a memory is generated based on a system clock pulse and a delayed system clock pulse obtained by delaying the system clock pulse by a delay circuit 2. In this precharge clock signal generating circuit, a reference dummy bit line (12a, 12b) is provided to have the same length as a bit line of a memory cell section and to be connected to dummy transistors (Tr1, · · · ) of the same number as the number of memory cells per a column of the memory cell section. The wiring capacitance of the reference dummy bit line and the junction capacitances of the respective dummy transistors are used as a fixed capacitance of the delay circuit 2 in the precharge clock signal generating circuit.

Also, a semiconductor circuit is described in Japanese Laid Open Patent Application (JP-A-Heisei 5-90939). In this reference, two inverters 2B and 2C having different threshold values are provided to be supplied with a voltage $V_A$ from a wiring line 3. Further, a delay circuit 5 is provided to delay the voltage $V_A$. Switches composed of NMOS 6 and PMOS 7 and NMOS 9 and PMOS 10 are provided on the output side of the inverters 2B and 2C, respectively. The switches are switched based on the output of the delay circuit 5 and an inverted signal of the output. The delay time of the delay circuit 5 is set such that the switching is performed immediately after the outputs of the inverters 2B and 2C are both set to the high or low level.

SUMMARY OF THE INVENTION

The present invention is accomplished to solve the above mentioned problems. Therefore, an object of the present invention is to provide a semiconductor integrated circuit in which an effective interline capacitance parasitically accompanies signal wiring lines for connecting the circuit blocks of the semiconductor integrated circuit.

Another object of the present invention is to provide a semiconductor integrated circuit in which an activation speed of a signal wiring line can be increased.

Still another object of the present invention is to provide a semiconductor integrated circuit in which a signal wiring line can be driven by a driving circuit with a small area without use of a driving circuit with a large area.

In order to achieve an aspect of the present invention, a semiconductor integrated circuit includes a plurality of signal wiring lines, and a plurality of shield wiring lines, each of which is arranged between an adjacent two of the plurality of signal wiring lines. An interference preventing section connected to the plurality of shield wiring lines, supplies to two of the plurality of shield wiring lines adjacent to a specific one of the plurality of signal wiring lines, an interference preventing signal which is switched to have a same phase as an input signal which is supplied to the specific signal wiring line.

The plurality of input signals are supplied to the plurality of signal wiring lines, and only one of the plurality of input signals is switched when the plurality of input signals are switched.

The interference preventing section includes a plurality of interference preventing circuits respectively connected to the shield wiring lines. In this case, each of the plurality of interference preventing circuits may include a NAND gate circuit, which has two input terminals that are connected to inverted signals of the input signals to two of the plurality of signal wiring lines adjacent to the shield wiring line corresponding to the interference preventing circuit, and which has an output terminal connected to the corresponding shield wiring line. Also, each of the plurality of interference preventing circuits may include a NOR gate circuit, which has two input terminals that are connected to two of the plurality of signal wiring lines adjacent to the shield wiring line corresponding to the interference preventing circuit, and an inverter connected to an output terminal of the NOR gate circuit and connected to the corresponding shield wiring line. In addition, each of the plurality of interference preventing circuits may include an exclusive OR gate circuit, which has two input terminals that are connected to inverted signals of the input signals to two of the plurality of signal wiring lines adjacent to the shield wiring line corresponding to the interference preventing circuit, and which has an output terminal connected to the corresponding shield wiring line.

The plurality of signal wiring lines and the plurality of shield wiring lines are provided in an insulating film formed on a semiconductor substrate, and each of the plurality of signal wiring lines is shielded by adjacent one or two of the plurality of shield wiring lines on one side or both sides of the signal wiring line. Also, when the plurality of signal wiring lines and the plurality of shield wiring lines are provided in a same first layer in the insulating film formed on the semiconductor substrate, it is desirable that the semiconductor integrated circuit further includes a plurality of first shield wiring patterns which are provided in a same second layer between the semiconductor substrate and the first layer. In this case, the plurality of shield wiring lines are respectively connected to the plurality of first shield wiring patterns. Otherwise, when the plurality of signal wiring lines and the plurality of shield wiring lines are provided in a same first layer in the insulating film formed on the semiconductor substrate, the semiconductor integrated circuit may further include a plurality of first shield wiring patterns which are provided in a same second layer between the semiconductor substrate and the first layer, and a plurality of second shield wiring patterns which are provided in a same third layer between the semiconductor substrate and the second layer. In this case, each of the plurality of shield wiring lines are alternatively connected to one of the plurality of first shield wiring patterns and the plurality of second shield wiring patterns. The first shield wiring pattern and the second shield wiring pattern, corresponding to the shield wiring lines which sandwich a specific one of the plurality of signal wiring lines, are provided to shield the specific signal wiring line from the semiconductor substrate.

It is desirable that the plurality of input signals are newly supplied after being reset to a predetermined level.

In order to achieve another aspect of the present invention, a method of increasing an activation speed of a signal wiring line in a semiconductor integrated circuit, includes the steps of:

providing a plurality of signal wiring lines; and shielding a specific one of the plurality of signal wiring lines from other of the plurality of signal wiring lines by first and second shield wiring lines which are provided to sandwich the specific signal wiring line without being connecting to predetermined potentials, when a plurality of input signals are supplied to the plurality of signal wiring lines such that only the specific signal wiring line of the plurality of signal wiring lines is activated.

In this case, the shielding step decreases an interline capacitance between the specific signal wiring line and each of the first and second shield wiring lines. The decreasing step includes supplying an interference preventing signal having a same phase as the input signal which is supplied to the specific signal wiring line, to the adjacent first and second shield wiring lines.

In the above method, the shielding step may further include shielding the specific signal wiring line from a semiconductor substrate. The step of shielding the specific signal wiring line from a semiconductor substrate includes providing first and second shield wiring patterns, which are respectively connected to the first and second shield wiring lines, between the specific signal wiring line and the semiconductor substrate.

In this case, when the specific signal wiring line and the first and second shield wiring lines are provided in a same first layer in an insulating film formed on the semiconductor substrate, the step of providing first and second shield wiring patterns includes providing the first and second shield wiring patterns in a same second layer between the semiconductor substrate and the first layer.

Instead, when the specific signal wiring line and the first and second shield wiring lines are provided in a same first layer in an insulating film formed on the semiconductor substrate, the step of providing first and second shield wiring patterns may include providing the first shield wiring pattern in a second layer between the semiconductor substrate and the first layer, and providing the second shield wiring pattern in a third second layer between the semiconductor substrate and the second layer.

The method may further include the step of resetting the plurality of input signals to a predetermined level before the plurality of input signals are newly supplied to the plurality of signal wiring lines.

BRIEF DESCRIPTION OF THE DRAWINGS

FIGS. 6A to 6I are timing charts illustrating the waveforms of the respective wiring lines of the semiconductor integrated circuit in the first embodiment;

DESCRIPTION OF THE PREFERRED EMBODIMENTS

Next, a semiconductor integrated circuit of the present invention will be described below in detail with reference to the attached drawings.

Figure 1:
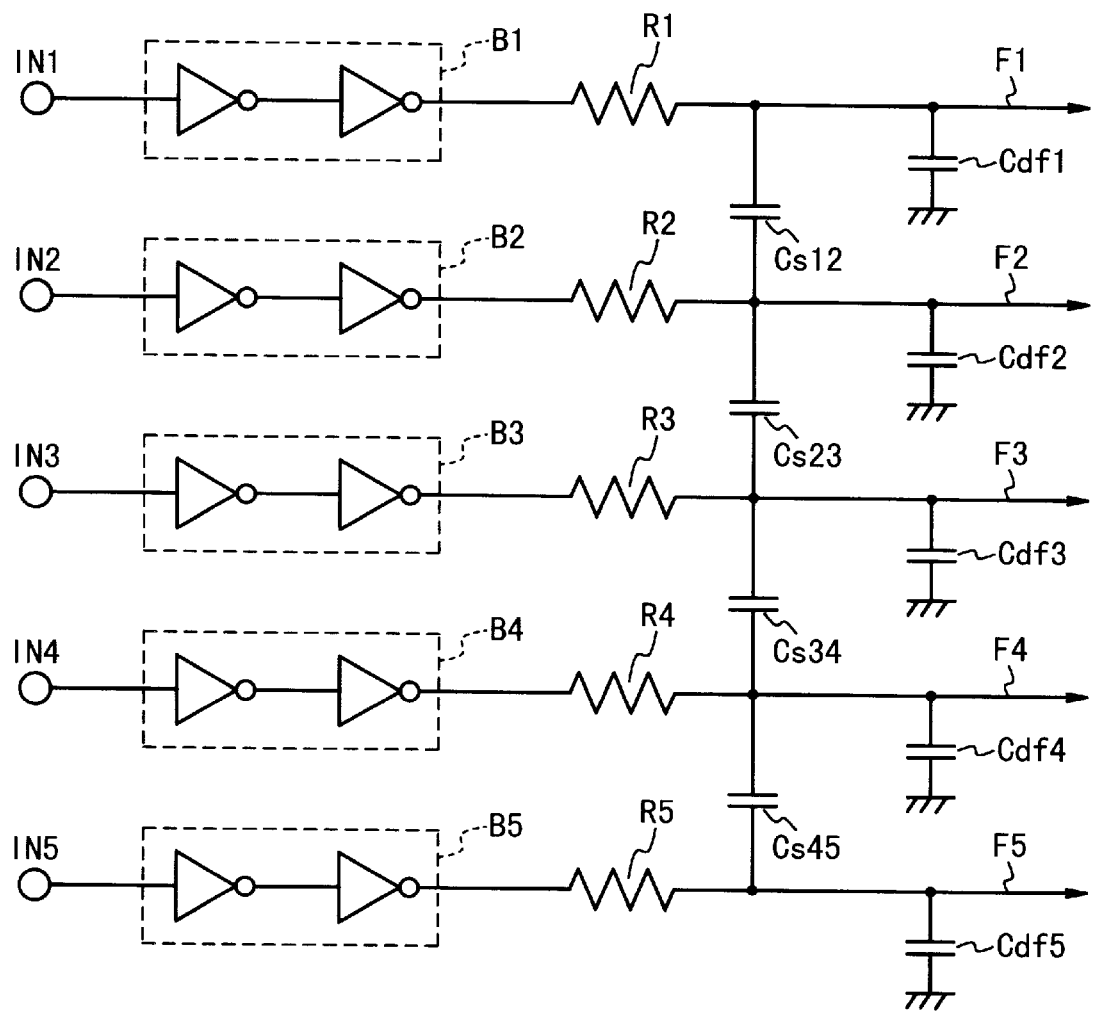
FIG. 1 is an equivalent circuit diagram of a semiconductor integrated circuit in a first conventional example.
Figure 2:
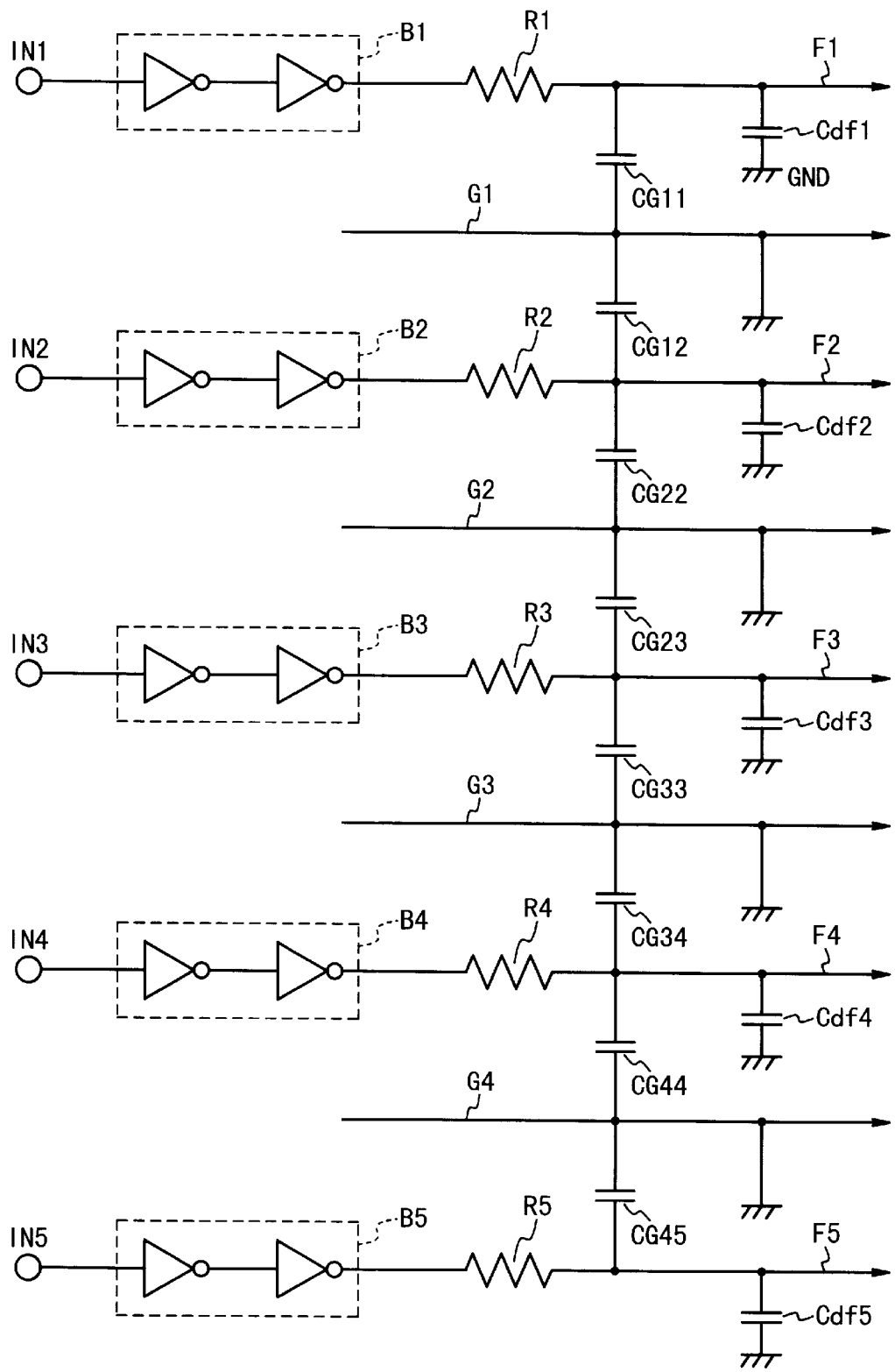
FIG. 2 is an equivalent circuit diagram of a semiconductor integrated circuit in a second conventional example.
Figure 3:
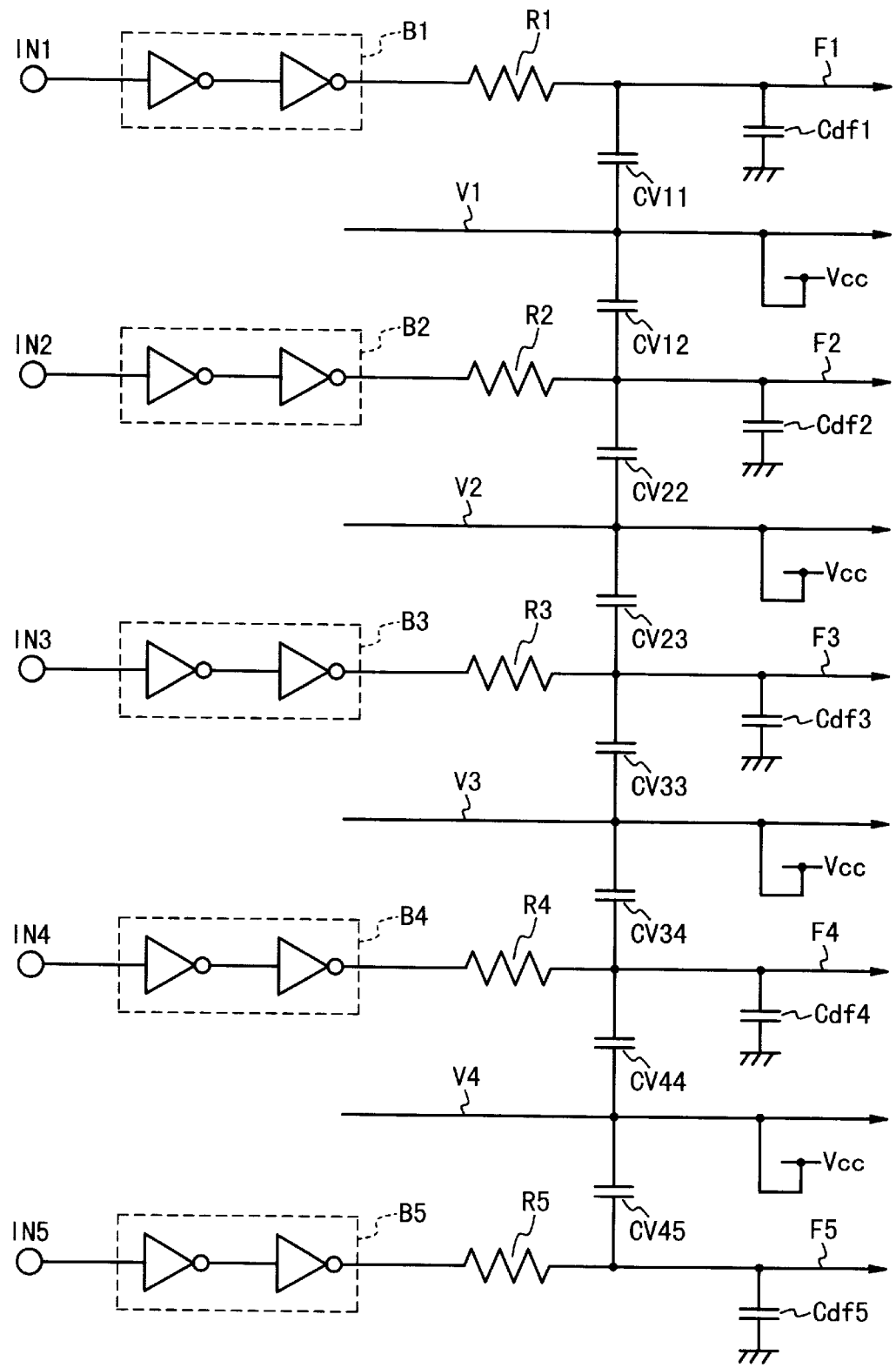
FIG. 3 is an equivalent circuit diagram of a semiconductor integrated circuit in a third conventional example.
Figure 5:
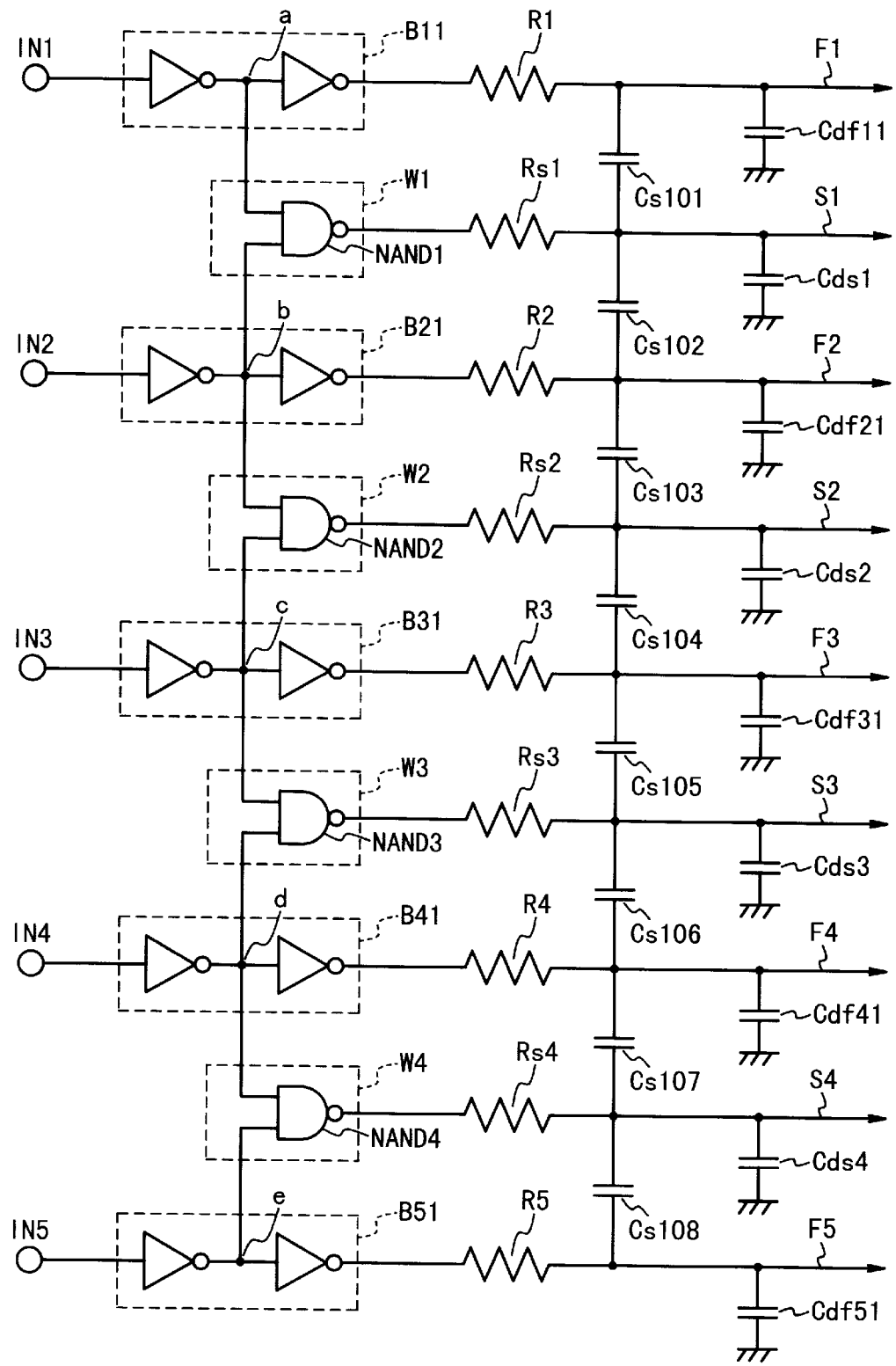
FIG. 5 is an equivalent circuit diagram of a semiconductor integrated circuit according to a first embodiment of the present invention.

FIG. 5 is a circuit diagram illustrating the structure of the semiconductor integrated circuit according to the first embodiment of the present invention. It should be noted that the same components as those in shown in FIG. 1 are allocated with the same reference characters or numerals. That is, the buffer circuits B11 to B51 are each composed of two inverting buffers and amplify the input signals IN1 to IN5. The signal wiring lines F1 to F5 are connected to the outputs of the buffer circuit B11 to B51, and are parasitically accompanied by the wiring line resistances R1 to R5. The capacitances Cdf11 to Cdf51 are interlayer capacitances between the signal wiring lines F1 to F5 and the lower wiring line layers or the semiconductor substrate. Thus, the above components are same as those in the conventional example shown in FIG. 1.

The interference preventing circuits W1 to W4 are composed of 2-input NAND gates NAND1 to NAND4, respectively. Input terminals of these 2-input NAND gates NAND1 to NAND4 are connected to the nodes a to e between the buffers of the adjacent buffer circuits. The nodes a to e have logic levels opposite to the output logic levels. That is, the node a between the two inverting buffers of the buffer circuit BF11 and the node b between the inverting buffers of the buffer circuit B21 are connected to the input terminals of the NAND gate NAND1. In the same way, the node b of the buffer circuit B21 and the node c of the buffer circuit B31 are connected to the input terminals of the NAND gate NAND2. The same thing is achieved for each of the NAND gates NAND3 and NAND4.

Also, shield wiring lines S1 to S4 are connected to the respective outputs of the NAND gates NAND1 to NAND4. These shield wiring lines S1 to S4 are arranged adjacently to the signal wiring lines F1 to F5 and in parallel to the signal wiring lines F1 to F5. Wiring line resistances Rs1 to Rs4 and interlayer capacities Cds1 to Cds4 are accompanied by the shield wiring lines S1 to S4, respectively. Also, interline capacities Cs101 to Cs108 between the signal wiring line F1 to F5 and the shield wiring line S1 to S4 are accompanied by the shield wiring lines S1 to S4, respectively.

Next, an operation of the semiconductor integrated circuit according to the first embodiment of the present invention will be described below.

Now, it is supposed that the input signals IN1 to IN5 to the buffer circuits B11 to B51 are a signal group in which only an optionally selected one of the input signals ON1 to IN5 is activated, as decoding signals. For example, when he signal IN2 is "H" level, all the other signals IN1, IN3, IN4 and IN5 are "L" level.

Now, when the signal wiring lines F1 to F5 are switched from the output state ① to the output state ② in the above table 1, the shield wiring lines S1 to S4 are switched as shown in the following table 2.

TABLE 2

| shield wiring line | output state ① | output state ② |
|---|---|---|
| S1 | H | L |
| S2 | H | L |
| S3 | L | H |
| S4 | L | H |

The table 2 can be illustrated as the signal waveforms of FIGS. 6A to 6I. From these waveforms, it could be understood that the waveforms of the shield wiring lines S3 and S4 which are arranged on both sides of the signal wiring line F4 are switched in the same manner as the signal wiring line F4 in phase. Therefore, it is possible to assume that the interline capacities Cs106 and Cs107 associated with the shield wiring lines S3 and S4 are almost zero in this case. Therefore, the activation speed of the signal wiring line F4 can be expressed as the following equation (3) using a time constant τ3.

$$\tau3 = R4 \times Cdf4' \quad (3)$$

When the equation (3) is compared with the equation (1) and the equation (2), it could be understood that the delay due to the interline capacitance is removed so that the activation speed of the signal wiring line F4 is largely improved.

In the above, a case is described in which the signal wiring line F2 is switched from the "H" level to the "L" level, and the signal wiring line F4 arranged over the signal wiring line F3 is switched from the "L" level to the "H" level. Next, a case will be described below in which the adjacent signal wiring lines are switched, e.g., the signal wiring line F3 is switched from the "H" level to the "L" level, and the signal wiring line F4 is switched from the "L" level to the "H" level.

The states of the signal wiring lines F1 to F5 in this case are shown in the following table 3 and the states of the shield wiring lines S1 to S4 are shown in the following table 4.

TABLE 3

| signal wiring line | output state ③ | output state ② |
|---|---|---|
| F1 | L | L |
| F2 | L | L |
| F3 | H | L |
| F4 | L | H |
| F5 | L | L |

TABLE 4

| shield wiring line | output state ③ | output state ② |
|---|---|---|
| S1 | H | L |
| S2 | H | L |
| S3 | L | H |
| S4 | L | H |

Figure 7A:
FIGS. 7A to 7C are timing charts illustrating the waveforms of the wiring lines S3, F4 and S4 of the semiconductor integrated circuit in the first embodiment.
Figure 7B:
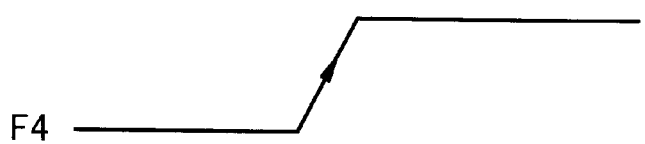
Figure 7C:
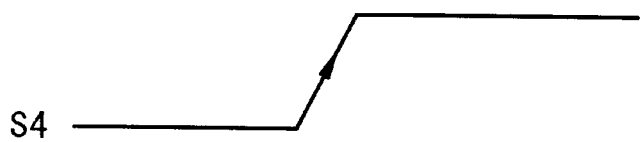

As seen from the tables 3 and 4, the shield wiring lines S3 and S4 arranged on both sides of the signal wiring line F4 are switched in response to the switching of the signal wiring line F4, as shown in FIGS. 7A to 7C. In this case, the potential difference is generated between the signal wiring line F4 and the shield wiring line S3, before the signal wiring line F4 is switched. Therefore, the interline capacitance Cs106 is excessively added, comparing with the case of FIGS. 6A to 6I. However, the shield wiring line S4 follows the switching of the signal wiring line F4. Therefore, the interline capacitance Cs107 is substantially zero. Thus, it is possible for the interline capacitance to be decreased to a large extent, compared with the conventional example shown in FIG. 1.

In another case, all the wiring line signals F1 to F5 may be set to "L" level in response to a reset signal, before the state is switched from the output state ③ to the output state ② in the table 3. Then, the input signals IN1 to IN5 corresponding to the output state ② are supplied. In this case, the shield wiring lines sandwiching any one of the signal wiring lines are activated in synchronous with the signal wiring line. Therefore, it is possible to decrease the interline capacitance to a large extent. In this method, a time Treset is needed for the reset signal. However, when the delay due to the interline capacitance is larger than the time Treset, it is possible to increase the activation speed of the signal wiring line as a whole.

Next, the structure of the semiconductor integrated circuit will be described with reference to FIG. 8. In this case, it is supposed that the wiring line interval S between every two adjacent wiring lines F1 to F5 is same as the signal wiring line interval S shown in FIG. 4.

Figure 4:
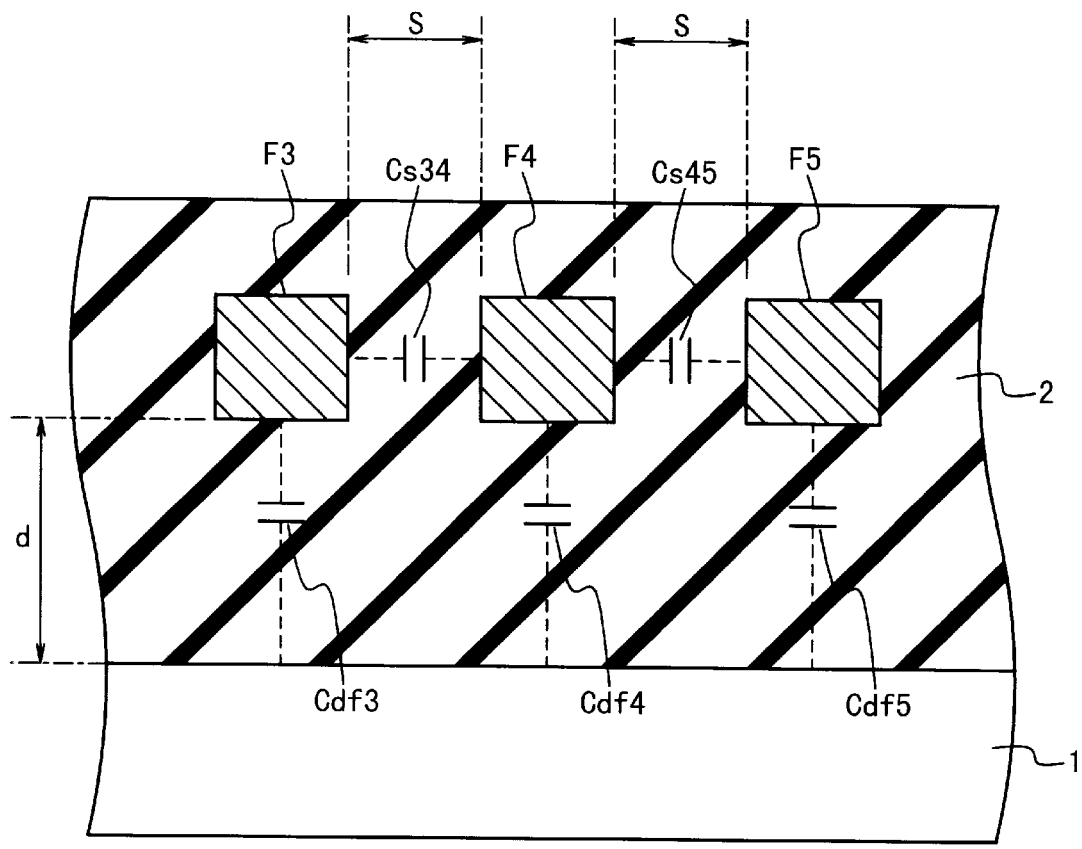
FIG. 4 is a cross sectional view illustrating the structure of the semiconductor integrated circuit in the first conventional example.
Figure 8:
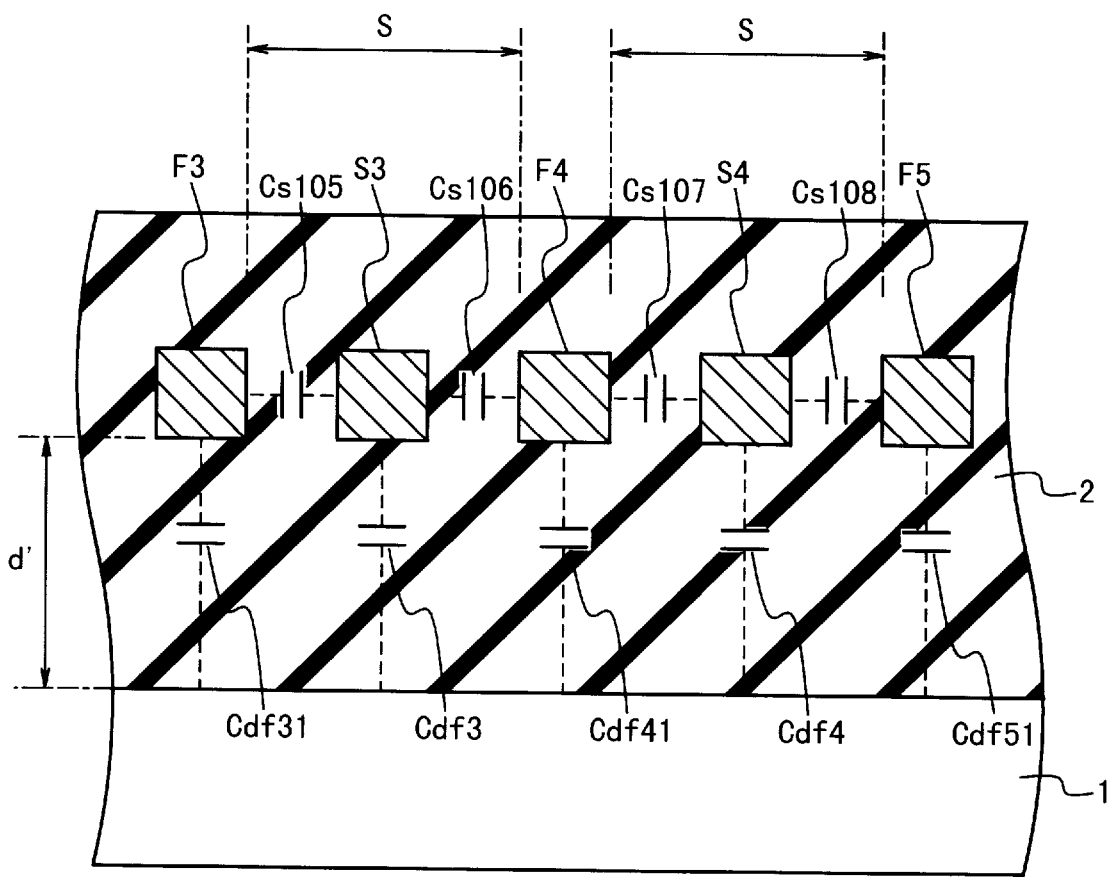
FIG. 8 is a cross sectional view illustrating the structure of the semiconductor integrated circuit in the first embodiment.

The basic structure shown in FIG. 8 is the same as that shown in FIG. 4, except that the shield wiring lines S3 and S4 are arranged between the signal wiring lines F3 and F4 and between the signal wiring lines F4 and F5, respectively.

However, the interline capacitances Cs105 to Cs108 increase to a large extent compared with the interline capacitances Cs34 and Cs45 shown in FIG. 4. The respective capacitance values determined through device simulation are as follows: Cs105 to Cs108=1.21 pF, and Cdf3 to Cdf5=0.44 pF.

The interline capacitances Cs105 to Cs108 increase by 3.7 times of the interline capacitances Cs34 and Cs45. In FIG. 4, the adjacent signal wiring lines are F3 and F4 or F4 and F5, while the signal wiring line F3 is adjacent to the shield wiring line S3 in FIG. 8. Thus, the increase of the interline capacitance is because the wiring line interval S is decreased to a large extent.

That is, in FIG. 4, the signal wiring line interval S between the signal wiring lines F3 to F5 needs to be widened more than the minimum size permissible in the circuit design, in order to prevent interference between the signal wiring lines. However, the wiring line interval S between any one of the signal wiring line F3 to F5 and the adjacent one of the shield wiring line S3 and S4 may be the minimum size permissible in the circuit design. This is because the activation speed of the signal wiring lines F3 to F5 can be increased by the shield wiring line S3 and S4 to a large extent, even if the wiring line interval S between adjacent two of the signal wiring lines F3 to F5 is the same as that shown in FIG. 4.

Also, the interlayer capacitances Cdf31 to Cdf51 of 0.44 pF are smaller than the interlayer capacitances Cdf3 to Cdf5 of 0.75 pF shown in FIG. 4. This is because the wiring line widths of the signal wiring lines S3 and S4 shown in FIG. 8 are set to be smaller than the wiring line widths of the signal wiring lines shown in FIG. 4.

Next, the simulation result of activation speed using the respective capacitance values and resistance values determined through the device simulation will be described with reference to FIG. 9. In this case, the area occupied by the buffer circuits B11 to B51 and the NAND gates NAND1 to NAND4 of FIG. 5 is set to be approximately equal to the area of the buffer circuits B1 to B5 as shown in FIG. 1. Thus, the current drive ability of the transistor of each of the buffer circuits B11 to B51 of FIG. 5 is set to ⅓ of the current drive ability of the transistor of each of the buffer circuits B1 to B5 of FIG. 1.

Figure 9:
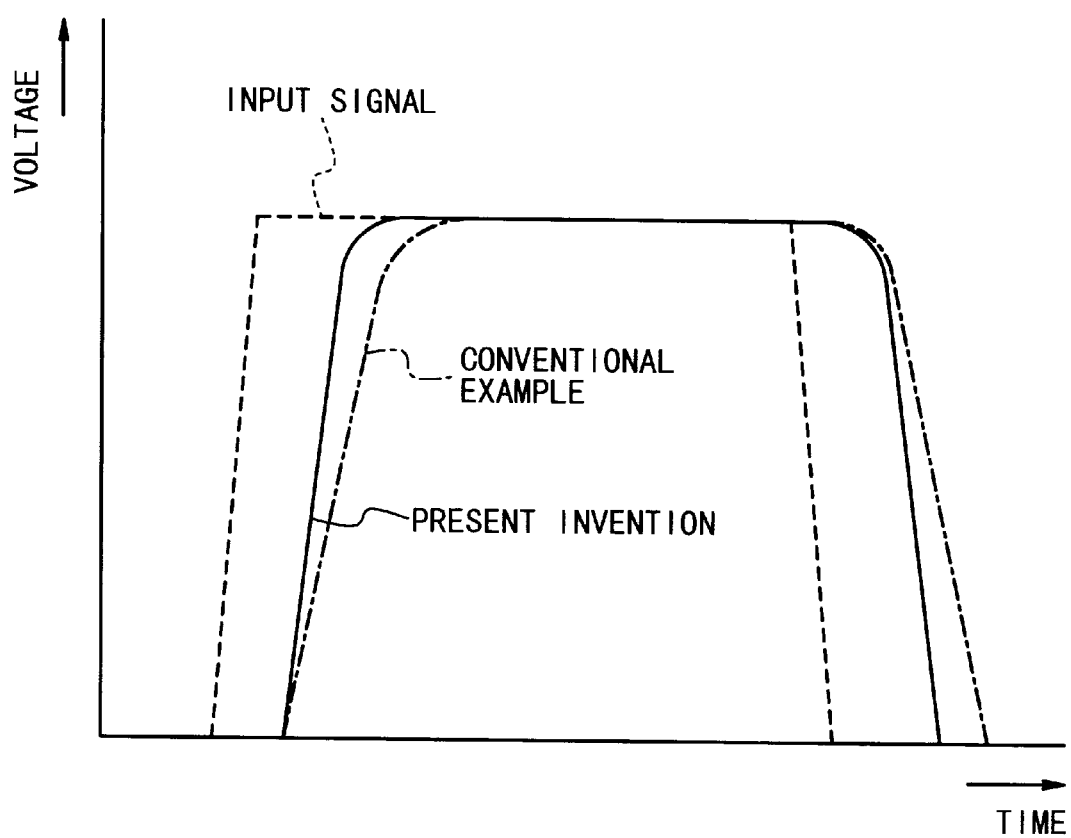
FIG. 9 is signal waveforms of an input signal, an output signal in the first embodiment, and an output signal in the conventional example.

As seen from FIG. 9, the activation speed of the signal wiring line F4 shown in FIG. 5 is increased, nevertheless the interline capacitance is greatly increased, compared with the conventional example shown in FIG. 1. Also, the current drive ability of the transistor of the buffer circuit is decreased to ⅓ that of the transistor of the buffer circuit shown in FIG. 1.

In the future, the wiring line interval between the signal wiring lines would be made narrower with the development of fine pattern forming technique. At this time, it would be expected that the ratio of the interline capacitance to the whole wiring line capacitance is further increased. Therefore, it would be expected that the interline capacitance has a larger influence on the access speed of the semiconductor integrated circuit in the future. In such a case, the present invention would show more effectiveness.

Figure 10:
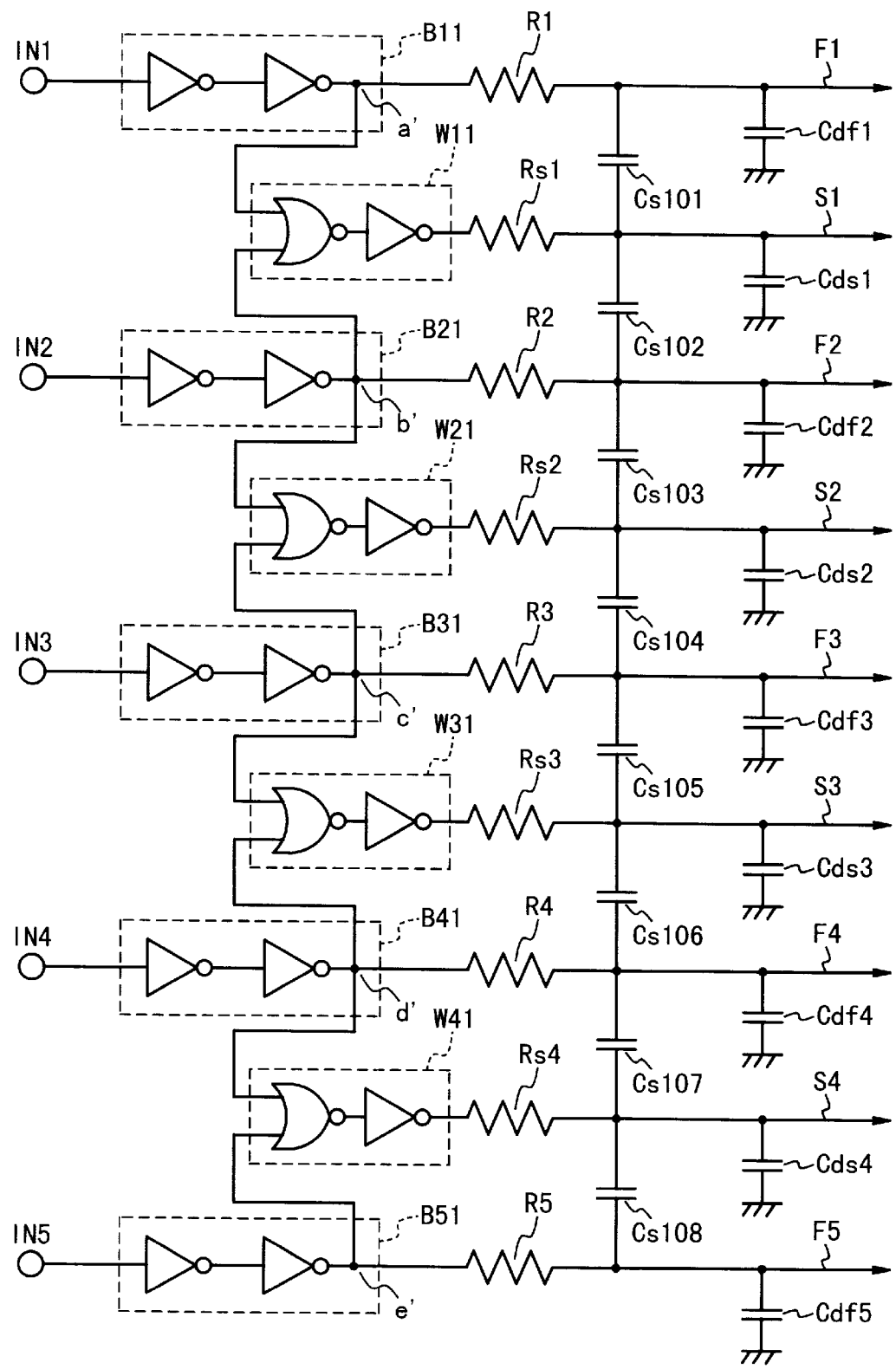
FIG. 10 is an equivalent circuit diagram of a first modification of the semiconductor integrated circuit according to the first embodiment of the present invention.
Figure 11:
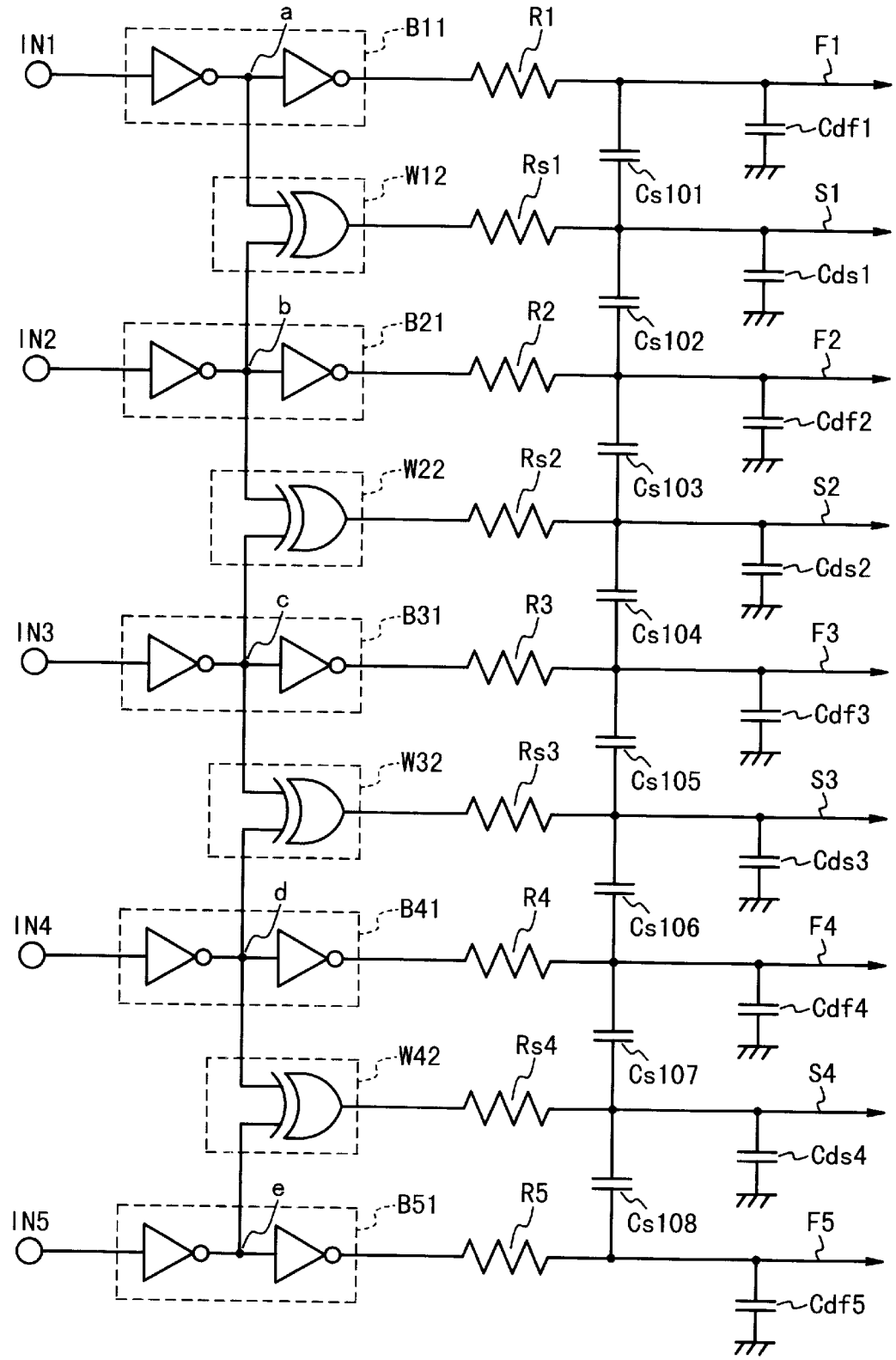
FIG. 11 is an equivalent circuit diagram of a second modification of the semiconductor integrated circuit according to the first embodiment of the present invention.

In the above description, each of the interference preventing circuits W1 to W4 is composed of NAND circuits NAND1 to NAND4, respectively. However, as in the first modification show in FIG. 10, each of the interference preventing circuits W11 to W41 may be composed of a 2-input NOR circuit and an inverter. The input terminals of the NOR circuit are connected to the outputs of the adjacent buffer circuits B11 to B51, respectively. The output of the NOR circuit is connected to the input of the inverter. Also, as in the second modification shown in FIG. 11, each of the interference preventing circuits W12 to W42 may be composed of an exclusive OR circuit. The input terminals of the exclusive OR circuit are connected to the nodes a to e of the adjacent buffer circuits B11 to B51, as in the first embodiment shown in FIG. 5. In this case, the interference preventing circuits W11 to W41 or W12 to W42 operate in the same manner as the interference preventing circuits W1 to W4, when only one of the input signals IN1 to IN5 is activated as decoding signals.

The circuit structure of the interference preventing circuit is not limited to the circuit structure described above. As shown in FIGS. 6A to 6I, the circuit structure may be adopted in which only one of the shield wiring lines which sandwich a selected signal wiring line is set to the "H" level when the selected signal wiring line is switched to the "H" level.

Figure 12:
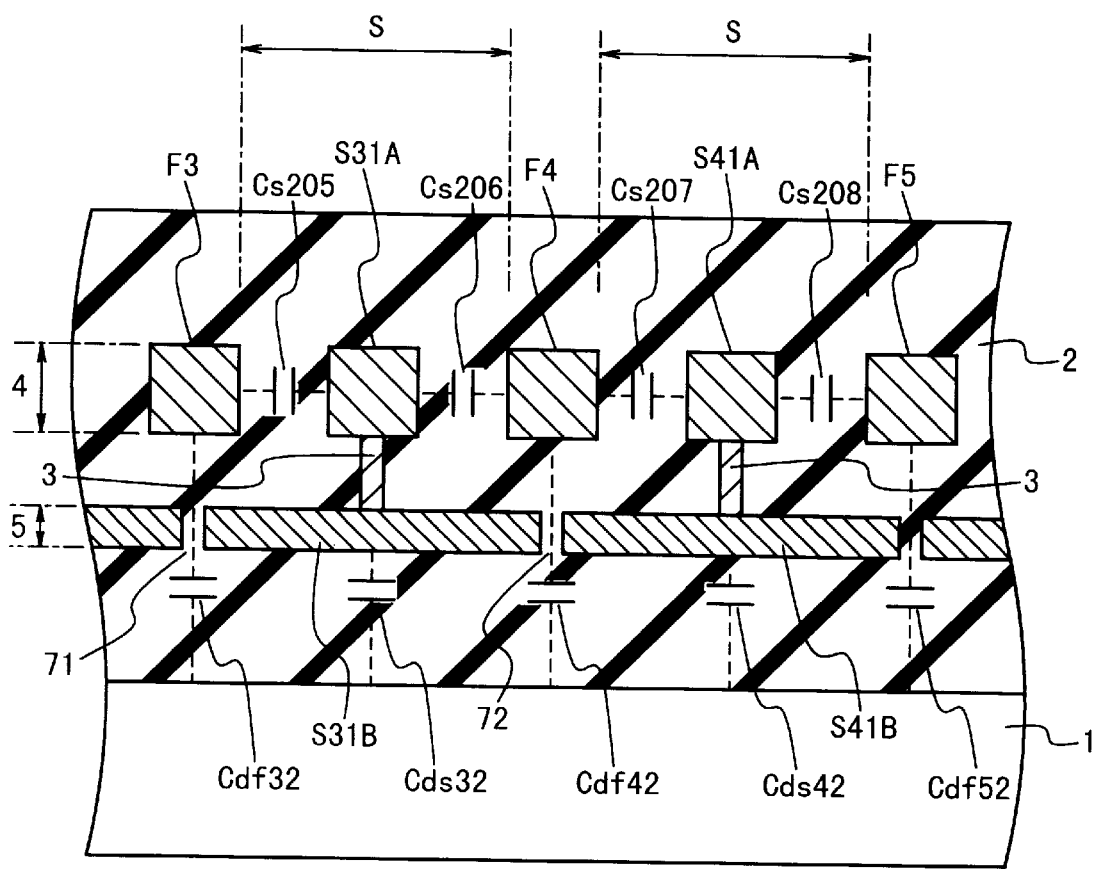
FIG. 12 is a cross sectional view illustrating the structure of the semiconductor integrated circuit according to a second embodiment of the present invention.

Next, the semiconductor integrated circuit according to the second embodiment of the present invention will be described with reference to FIG. 12. FIG. 12 shows the cross sectional view of the semiconductor integrated circuit in the second embodiment which includes the signal wiring lines F3 to F5, and the shield wiring lines S31A and S31B, and S41A and S41B.

In FIG. 12, the signal wiring lines F3 to F5, and the shield wiring lines S31A and S41A are formed in a first wiring line region 4. Also, the shield wiring patterns S31B and S41B are formed in a second wiring line region 5. Also, the shield wiring lines S31A and S41A are connected to the shield wiring patterns S31B and S41B through contacts 3, respectively. The contact 3 may be formed of metal such as aluminum or conductive polysilicon.

In such a structure, an interline capacitance Cs205 is a capacitance between the signal wiring line F3 and the shield wiring line S31A. Also, an interlayer capacitance Cdf32 is a capacitance between the signal wiring line F3 and the semiconductor substrate 1. Similarly, the interline capacitances Cs206 to Cs208 are capacitances between adjacent two of the signal wiring lines F4 and F5 and the shield wiring lines S31A and S41A, respectively. Also, the interlayer capacitance Cdf42 is a capacitance between the signal wiring line F4 and the semiconductor substrate 1, and the interlayer capacitance Cdf52 is between the signal wiring line F5 and the semiconductor substrate 1.

The signal wiring line F4 is shielded by the shield wiring lines S31A and S41A on both sides. In addition, the signal wiring line F4 is shielded by the shield wiring patterns S31B and S41B in a vertical direction. Therefore, the shield effect is higher than the structure shown in FIG. 8. Further, the interlayer capacitances Cdf32 to Cdf52 are formed between the signal wiring lines F3 to F5 and the semiconductor substrates 1 through slits 71 to 73, respectively. Thus, the interlayer capacitances Cdf32 to Cdf52 can be made very small. In the structure shown in the interlayer capacitance is dominant in the activation speed when the shield wiring lines S1 to S4 are adopted. Therefore, the activation speed of the signal wiring line can be made higher.

In this structure, the interlayer capacitances of the shield wiring lines S31A and S41A become large to generate unbalance with the interlayer capacitances of the signal wiring line F4 and F5. However, the activation speed of the activated signal wiring line can be further increased. In this case, it is necessary that the current drive ability of each transistor of the buffer circuit and interference preventing circuit is adjusted and a ratio of the wiring line resistance of the signal wiring line and the wiring line resistance of the shield wiring line is adjusted.

Figure 13:
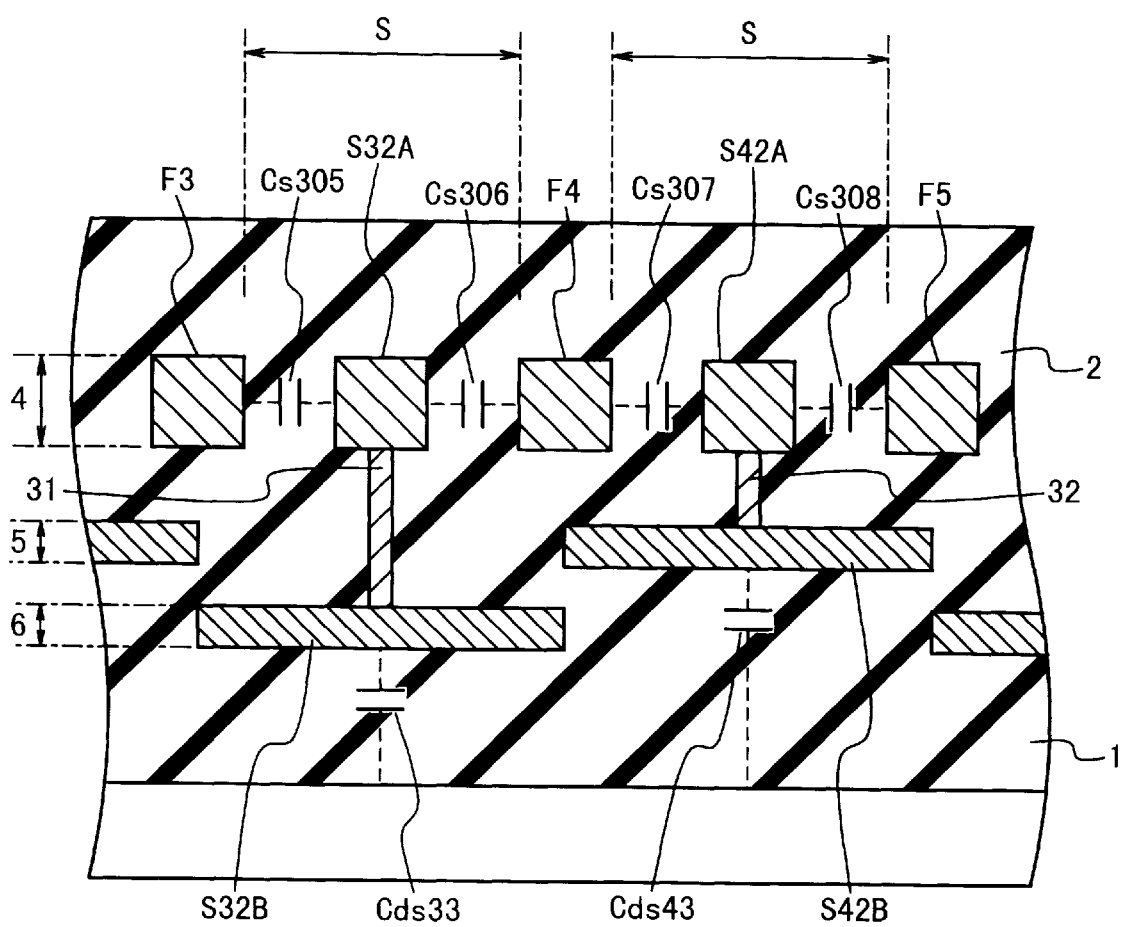
FIG. 13 is a cross sectional view illustrating the structure of the semiconductor integrated circuit according to a third embodiment of the present invention.

Also, FIG. 13 shows the structure of the semiconductor integrated circuit according to the third embodiment of the present invention. Referring to FIG. 13, the signal wiring lines F3 to F5, and the shield wiring lines S32A and S42A are formed in a first wiring line region 4. The shield wiring pattern S42B is formed in a second wiring line region 5 and the shield wiring pattern S32B is formed in a third wiring line region 6. Also, the shield wiring lines S32A and S42A are connected to the shield wiring patterns S32B and S42B through contacts 31 and 32, respectively.

In such a structure, an interline capacitance Cs305 is between the signal wiring line F3 and the shield wiring line S32A. Similarly, interline capacitances Cs306 to Cs308 are capacitances between adjacent two of the signal wiring lines F4 and F5 and the shield wiring lines S32A and S42A. The signal wiring line F4 is shielded by the shield wiring lines S32A and S42A on both sides. In addition, the signal wiring line F4 is completely shielded from the semiconductor substrate 1 by the shield wiring patterns S32B and S42B in the vertical direction. Therefore, the interlayer capacitance of the signal wiring line F4 can be made small to the extent possible to ignore the interlayer capacitance. Therefore, the activation speed of the signal wiring line can be made higher because the interlayer capacitance is dominant in the activation speed when the shield wiring lines are formed.

As described above, according to the semiconductor integrated circuit of the present invention, it is possible to improve the activation speed of the signal wiring line. More specifically, when an optionally selected one of the input signals is activated as decoding signals, the selected signal wiring line and the shield wiring lines sandwiching the selected signal wiring line are switched in phase. Therefore, the interline capacitance between each of the shield wiring line and the activated signal wiring line is made small, resulting in the improvement of the activation speed.

Further, the interlayer capacitance of the signal wiring line which is a dominant factor in the activation speed can be made small. Therefore, the activation speed of the signal wiring line can be more increased.

Also, it is possible to drive the signal wiring line by a driving circuit with a small area without use of a driving circuit with a large area.

What is claimed is:

1. A semiconductor integrated circuit comprising:
a plurality of signal wiring lines;
a plurality of shield wiring lines, each of which is arranged between adjacent two of said plurality of signal wiring lines;
an interference preventing section connected to said plurality of shield wiring lines, for supplying to two of said plurality of shield wiring lines adjacent to a specific one of said plurality of signal wiring lines, an interference preventing signal which is switched to have a same phase as an input signal which is supplied to said specific signal wiring line, wherein said interference preventing section includes a plurality of interference preventing circuits, each of said plurality of interference preventing circuits including a gate circuit having two input terminals that receive input from two of said plurality of siganl wiring lines adjacent to said shield wiring line corresponding to said each interference preventing circuit and provides output to said shield wiring line, wherein said gate circuit includes at least one of: a NAND gate, a NOR gate, and an exclusive OR gate.

2. The semiconductor integrated circuit according to claim 1, wherein said interference preventing section includes said plurality of interference preventing circuits respectively connected to said shield wiring lines.

3. The semiconducter integrated circuit according to claim 1, wherein said plurality of input signals are newly supplied after being reset to a predetermined level.

4. A semiconductor integrated circuit comprising:
a plurality of signal wiring lines;
a plurality of shield wiring lines, each of which is arranged between adjacent two of said plurality of signal wiring lines;
an interference preventing section connected to said plurality of shield wiring lines, for supplying to two of said plurality of shield wiring lines adjacent to a specific one of said plurality of signal wiring lines, an interference preventing signal which is switched to have a same phase as an input signal which is supplied to said specific signal wiring line,
wherein a plurality of said input signals are supplied to said plurality of signal wiring lines, and only one of said plurality of input signals is switched when said plurality of input signals are switched, wherein said interference preventing section includes a plurality of interference preventing circuits, each of said plurality of interference preventing circuits including a gate circuit having two input terminals that receive input from two of said plurality of signal wiring lines adjacent to said shield wiring line corresponding to said each interference preventing circuit and provides output to said shield wiring line, wherein said gate circuit includes at least one of: a NAND gate, a NOR gate, and an exclusive OR gate.

5. A semiconductor integrated circuit comprising:
a plurality of signal wiring lines;
a plurality of shield wiring lines, each of which is arranged between adjacent two of said plurality of signal wiring lines;
an interference preventing section connected to said plurality of shield wiring lines, for supplying to two of said plurality of shield wiring lines adjacent to a specific one of said plurality of signal wiring lines, an interference preventing signal which is switched to have a same phase as an input signal which is supplied to said specific signal wiring line,
wherein said interference preventing section includes a plurality of interference preventing circuits respectively connected to said shield wiring lines, and
wherein each of said plurality of interference preventing circuits includes a NAND gate circuit, which has two input terminals are connected to inverted signals of said input signals to two of said plurality of signal wiring lines adjacent to said shield wiring line corresponding to said interference preventing circuit, and which has an output terminal connected to said corresponding shield wiring line.

6. A semiconductor integrated circuit comprising:

a plurality of signal wiring lines;

a plurality of shield wiring lines, each of which is arranged between adjacent two of said plurality of signal wiring lines;

an interference preventing section connected to said plurality of shield wiring lines, for supplying to two of said plurality of shield wiring lines adjacent to a specific one of said plurality of signal wiring lines, an interference preventing signal which is switched to have a same phase as an input signal which is supplied to said specific signal wiring line, wherein said interference preventing section includes a plurality of interference preventing circuits respectively connected to said shield wiring lines, and, wherein each of said plurality of interference preventing circuits includes:

a NOR gate circuit, which has two input terminals are connected to two of said plurality of signal wiring lines adjacent to said shield wiring line corresponding to said interference preventing circuit; and an inverter connected to an output terminal of said NOR gate circuit and connected to said corresponding shield wiring line.

7. A semiconductor integrated circuit, comprising, a plurality of signal wiring lines;

a plurality of shield wiring lines, each of which is arranged between adjacent two of said plurality of signal wiring lines;

an interference preventing section connected to said plurality of shield wiring lines, for supplying to two of said plurality of shield wiring lines adjacent to a specific one of said plurality of signal wiring lines, an interference preventing signal which is switched to have a same phase as an input signal which is supplied to said specific signal wiring line, wherein said interference preventing section includes a plurality of interference preventing circuits respectively connected to said shield wiring lines, and wherein each of said plurality of interference preventing circuits includes an exclusive OR gate circuit, which has two input terminals are connected to inverted signals of said input signals to two of said plurality of signal wiring lines adjacent to said shield wiring line corresponding to said interference preventing circuit, and which has an output terminal connected to said corresponding shield wiring line.

8. A semiconductor integrated circuit comprising:

a plurality of signal wiring lines;

a plurality of shield wiring lines, each of which is arranged between adjacent two of said plurality of signal wiring lines;

an interference preventing section connected to said plurality of shield wiring lines, for supplying to two of said plurality of shield wiring lines adjacent to a specific one of said plurality of signal wiring lines, an interference preventing signal which is switched to have a same phase as an input signal which is supplied to said specific signal wiling line, wherein said plurality of signal wiring lines and said plurality of shield wiring lines are provided in an insulating film formed on a semiconductor substrate, and wherein each of said plurality of signal wiring lines is shielded by adjacent one or two of said plurality of shield wiring lines on one side or both sides of said signal wiring line, wherein said interference preventing section includes a plurality of interference preventing circuits, each of said plurality of interference preventing circuits including a gate circuit having two input terminals that receive input from two of said plurality of signal wiring lines adjacent to said shield wiring line corresponding to said each interference preventing circuit and provides output to said shield wiring line, wherein said gate circuit includes at least one of: a NAND gate, a NOR gate, and an exclusive OR gate.

9. The semiconductor integrated circuit according to claim 8, wherein said plurality of signal wiring lines and said plurality of shield wiring lines are provided in a same first layer in said insulating film formed on said semiconductor substrate, and wherein said semiconductor integrated circuit further includes a plurality of first shield wiring patterns which are provided in a same second layer between said semiconductor substrate and said first layer, and wherein said plurality of shield wiring lines are respectively connected to said plurality of first shield wiring patterns.

10. The semiconductor integrated circuit according to claim 8, wherein said plurality of signal wiring lines and said plurality of shield wiring lines are provided in a same first layer in said insulating film formed on said semiconductor substrate, and wherein said semiconductor integrated circuit further includes:

a plurality of first shield wiring patterns which are provided in a same second layer between said semiconductor substrate and said first layer; and a plurality of second shield wiring patterns which are provided in a same third layer between said semiconductor substrate and said second layer, and wherein each of said plurality of shield wiring lines are alternatively connected to one of said plurality of first shield wiring patterns and said plurality of second shield wiring patterns.

11. The semiconductor integrated circuit according to claim 10, wherein said first shield wiring pattern and said second shield wiring pattern, corresponding to said shield wiring lines which sandwich a specific one of said plurality of signal wiring lines, are provided to shield said specific signal wiring line from said semiconductor substrate.

12. A method of increasing an activation speed of a signal wiring line in a semiconductor integrated circuit, comprising the steps of:

providing a plurality of signal wiring lines providing a plurality of shield wiring lines; and shielding a specific one of said plurality of signal wiring lines from other of said plurality of signal wiring lines by first and second of said plurality of shield wiring lines which are provided to sandwich said specific one signal wiring line without being connecting to predetermined potentials, when a plurality of input signals are supplied to said plurality of signal wiring lines such that only said specific one signal wiring line of said plurality of signal wiring lines is activated;

connecting an interference preventing section to said plurality of shield wiring lines, for supplying to two of said plurality of shield wiring lines adjacent to a specific one of said plurality of signal wiring lines, an interference preventing signal which is switched to have a same phase as an input signal which is supplied to said specific signal wiring line, wherein said interference preventing section includes a plurality of interference preventing circuits, each of said plurality of interference preventing circuits including a gate circuit having two input terminals that receive input from two of said plurality of signal wiring lines adjacent to said shield wiring line corresponding to said each interference preventing circuit and provides output to said shield wiring line, wherein said gate circuit includes at least one of: a NAND gate, a NOR gate, and an exclusive OR gate.

13. The method according to claim 12, wherein said shielding step includes decreasing an interline capacitance between said specific signal wiring line and each of said first and second shield wiring lines.

14. The method according to claim 13, wherein said decreasing step includes supplying an interference preventing signal having a same phase as said input signal which is supplied to said specific signal wiring line, to said adjacent first and second shield wiring lines.

15. The method according to claim 12, further comprising the step of resetting said plurality of input signals to a predetermined level before said plurality of input signals are newly supplied to said plurality of signal wiring lines.

16. A method of increasing an activation speed of a signal wiring line in a semiconductor integrated circuit, comprising the steps of:

providing a plurality of signal wiring lines;

providing a plurality of shield wiring lines;

shielding a specific one of said plurality of signal wiring lines from other of said plurality of signal wiring lines by first and second of said plurality shield wiring lines which are provided to sandwich said specific signal wiring line without being connecting to predetermined potentials, when a plurality of input signals are supplied to said plurality of signal wiring lines such that only said specific signal wiring line of said plurality of signal wiring lines is activated, wherein said shielding step further includes shielding said specific signal wiring line from a semiconductor substrate; and connecting an interference preventing section to said plurality of shield wiring lines, for supplying to two of said plurality of shield wiring lines adjacent to a specific one of said plurality of signal wiring lines, an interference preventing signal which is switched to have the same phase as an input signal which is supplied to a specific signal wiring line, wherein said interference preventing section includes a plurality of interference preventing circuits, each of said plurality of interference preventing circuits including a gate circuit having two input terminals that receive input from two of said plurality of signal wiring lines adjacent to said shield wiring line corresponding to said each interference preventing circuit and provides output to said shield wiring line, wherein said gate circuit includes at least one of: a NAND gate, a NOR gate, and an exclusive OR gate.

17. The method according to claim 16, wherein said step of shielding said specific signal wiring line from a semiconductor substrate includes:

providing first and second shield wiring patterns, which are respectively connected to said first and second shield wiring lines, between said specific signal wiring line and said semiconductor substrate.

18. The method according to claim 17, wherein said specific signal wiring line and said first and second shield wiring lines are provided in a same first layer in an insulating film formed on said semiconductor substrate, and wherein said step of providing first and second shield wiring patterns includes providing said first and second shield wiring patterns in a same second layer between said semiconductor substrate and said first layer.

19. The method according to claim 17, wherein said specific signal wiring line and said first and second shield wiring lines are provided in a same first layer in an insulating film formed on said semiconductor substrate, and wherein said step of providing first and second shield wiring patterns includes:

providing said first shield wiring pattern in a second layer between said semiconductor substrate and said first layer; and providing said second shield wiring pattern in a third second layer between said semiconductor substrate and said second layer.

* * * * *